United States Patent [19]

Anzai et al.

[11] Patent Number: 4,883,345

[45] Date of Patent: Nov. 28, 1989

[54] PROJECTION OPTICAL APPARATUS

[75] Inventors: Satoru Anzai, Zama; Hiroshi Tanaka, Yokohama, both of Japan

[73] Assignee: Nikon Corporation, Tokyo, Japan

[21] Appl. No.: 291,324

[22] Filed: Dec. 28, 1988

[30] Foreign Application Priority Data

Dec. 2, 1983 [JP] Japan .................................. 58-228225
Dec. 2, 1983 [JP] Japan .................................. 58-228226
Mar. 16, 1984 [JP] Japan .................................. 59-50763

[51] Int. Cl.⁴ .................................................. G02B 3/12
[52] U.S. Cl. .................................................. 350/418
[58] Field of Search ........................ 350/418, 419, 413

[56] References Cited

U.S. PATENT DOCUMENTS 3,498,695 10/1966 Brouwer .
3,528,727 9/1970 Halliday .............................. 350/413
4,331,388 5/1982 McCrobie et al. ................. 350/419
4,616,908 10/1986 King .................................... 350/418

OTHER PUBLICATIONS

J. D. Rees, *Xerox Disclosure Journal*, "Technique for Varying Focal Length of a Lens", vol. 1, Nos. 11/12, Nov./Dec. 1976.

*Primary Examiner*—Bruce Y. Arnold
*Assistant Examiner*—Rebecca D. Gass
*Attorney, Agent, or Firm*—Shapiro and Shapiro

[57] ABSTRACT

An apparatus for projecting a pattern on a first plane onto a second plane comprises a projection lens system disposed between the first plane and the second plane and including a plurality of lens elements disposed at intervals, a plurality of spaces defined by the plurality of lens elements being formed, and means for isolating at least one of the plurality of spaces from the atmosphere. The at least one space is determined so that the variation in magnification of the projection lens system when the pressure in the at least one space varies with the atmospheric pressure is substantially equal to the variation in magnification of the projection lens system when all of the pressure in the space formed between the first plane and the projection lens system, the pressures in the plurality of spaces of the projection lens system and the pressure in the space formed between the projection lens system and the second plane vary with the atmospheric pressure.

10 Claims, 5 Drawing Sheets

PROJECTION OPTICAL APPARATUS

This is a continuation application of Ser. No. 122,510 filed Nov. 18, 1987, which is a continuation application of Ser. No. 674,840 filed Nov. 26, 1984, both abandoned.

BACKGROUND OF THE INVENTION

1. Field of the Invention

This invention relates to a projection optical apparatus, and more particularly to an optical apparatus used to project a minute pattern formed on a photomask or a reticle onto a semiconductive wafer.

2. Description of the Prior Art

A projection exposure apparatus using a projection lens can obtain high alignment accuracy and superposition accuracy and greatly contributes to the production of VLSI. Such projection exposure apparatus projects the image of the pattern on the photomask or the reticle onto the wafer having photoresist applied thereto at a predetermined magnification by the projection lens.

Matching accuracy may be mentioned as one of the important performance criteria of such exposure apparatus. An important one of the factors which affect this matching accuracy is the magnification error of the projection optical system. The size of the pattern used in VLSI has a strong tendency toward minuteness and along therewith, the need for improved matching accuracy has become strong. Accordingly, the necessity of keeping the projection magnification at a predetermined value has become very high. At present, the magnification of the projection optical system is at such a degree that the magnification error can be tentatively neglected by adjusting it when the apparatus is installed. However, to sufficiently cope with the tendency of VLSI toward higher density, it is necessary to correct even the magnification error produced when environmental conditions such as the slight fluctuation of the atmospheric pressure in the clean room during the operation of the apparatus change.

A method of mechanically varying the spacing of the projection lens with respect to the object or the image plane or moving the lens elements of the projection lens in the direction of the optic axis to correct the projection magnification of the projection optical system has been popular. However, where highly accurate magnification setting is required, the conventional correcting method which imparts mechanical displacement to the optical elements has been unsuitable because the shift or tilt of the movable portion prevents the optic axis from being properly maintained. That is, the optical system including the object becomes non-coaxial, and this leads to a disadvantage in that a magnification distribution asymmetric with respect to the optic axis occurs on the image plane. Also, to set the magnification accurately so that an error of only 0.05 $\mu$m or less occurs on the wafer, it is necessary to control the amount of variation in the optical elements to several $\mu$m to 1 $\mu$m, inclusive of shift or tilt, and realization of this would involve many difficulties.

SUMMARY OF THE INVENTION

It is an object of the present invention to eliminate the above-noted disadvantages and to provide a projection optical apparatus which is capable of simply maintaining the magnification constant without creating an asymmetric magnification distribution.

In making the present invention, it has been found that one of the factors for the fluctuation of the projection magnification of the projection lens is the fluctuation of the atmospheric pressure, and it has also been found that there are cases where the projection magnification is varied to a signification degree by only the fluctuation of the pressure.

Therefore, according to the present invention, of the air spaces in the projection lens, the space between the projection lens and the photomask or the reticle and the space between the projection lens and the wafer, some or all of the air chambers formed between the lens elements of the projection lens are shielded from the atmosphere and these shielded air chambers are hermetically sealed at a predetermined pressure to thereby eliminate the fluctuation of the pressure in the lens and enable the maintenance of practically sufficient magnification accuracy.

According to the present invention, correction of the magnification is effected only in the projection lens without being concerned with the photomask or the reticle interchangeably mounted in the exposure apparatus and the photosensitive object (wafer) frequently moved during each exposure and alignment, and this leads to a simple construction. No mechanical movement is required for the correction, and there is no undesirable, possibility of creating eccentricity and degrading the imaging performance asymmetrically.

Also, in the present invention, it is desirable to set the interior of the projection lens to a predetermined, pressure when hermetically sealing it. Generally, the place in which the projection lens is manufactured differs from the place in which the projection exposure apparatus incorporating such lens therein is used and therefore, there is basically a difference in atmospheric pressure between the two places due to the difference in the height above sea-level or the like. For this reason, it is preferable to provide a barometric controller for adjusting the pressure in the projection lens to an optimum value in conformity with the environment of the place in which the apparatus is used.

DESCRIPTION OF THE PREFERRED EMBODIMENTS

Figure 1:
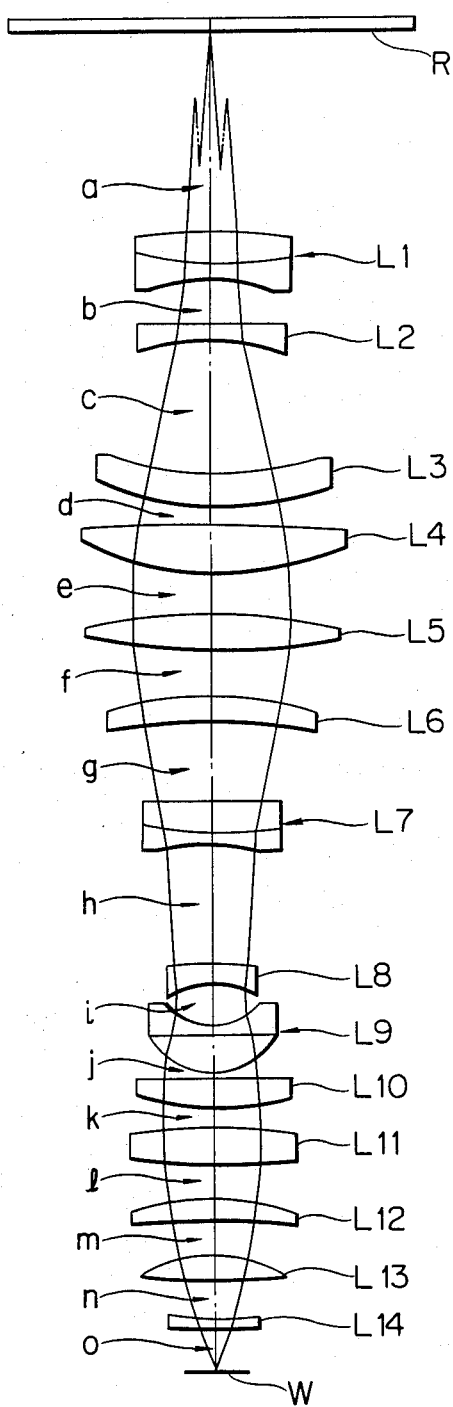
FIG. 1 shows the construction of the optical system of a projection lens used in each embodiment of the present invention.

In FIG. 1, there is shown a projection lens used in each embodiment which will later be described. The projection lens reduction-projects the predetermined pattern on a reticle R onto a wafer W. Light rays representing the conjugate relation between an on-axis point on the wafer and an on-axis point on the reticle are shown in the Figure. This projection lens comprises fourteen lenses L1, L2, ..., L14 in succession from the reticle R side, and fifteen air spaces a, b, c, ..., o are formed between the reticle R and the wafer W in succession from the reticle side. The numerical data of this objective lens are shown in Table 1 below. In Table 1, $\gamma$ represents the radius of curvature of each lens surface, D represents the center thickness and air space of each lens, N represents the refractive index of each lens for the i-line ($\lambda$ = 365.0 nm), and the leftmost numbers represent the order from the reticle side. $D_0$ represents the spacing between the reticle R and the foremost lens surface, and $D_{31}$ represents the spacing between the rearmost lens surface and the wafer W.

Assuming that in this objective lens, the atmospheric pressures in the air spaces a, b, ..., o have been varied by + 137.5 mmHg, the relative refractive index of each air space changes to 1.00005, and the variation $\Delta X$ in magnification and the variation $\Delta Z$ in the imaging plane, i.e., the plane conjugate with the reticle R, at this time are as shown in Table 2 below. As regards the variation $\Delta X$ in magnification, the amount of movement of the image point imaged at a location spaced apart by 5.66 mm from the optic axis when there is no fluctuation of the atmospheric pressure on the imaging plane, after the atmospheric pressure in each air space has been varied, is represented in the unit of $\mu$m, and the case where the image point is projected more greatly (enlargement) on the imaging plane, i.e., the predetermined wafer surface, when there is no fluctuation of the atmospheric pressure is shown as the positive sign. As regards the variation $\Delta Z$ in the imaging plane, the change of the imaging point on the axis is represented in the unit of $\mu$m and the case where the imaging point goes away from the projection lens is shown as the positive sign. The values of the two are in the unit of $\mu$m.

TABLE 1

| No. | r | D | N | |
|---|---|---|---|---|
| | | $D_0 = 259.78958$ | 1.000000 | a |
| 1 | 143.86900 | 9.97570 | 1.504150 | L1 |
| 2 | −81.46300 | 3.42920 | 1.602500 | |
| 3 | 51.49700 | 14.02840 | 1.000000 | b |
| 4 | 540.12700 | 4.98790 | 1.602500 | L2 |
| 5 | 62.56200 | 41.77340 | 1.000000 | c |
| 6 | −68.02600 | 9.66400 | 1.562260 | L3 |
| 7 | −74.29500 | 4.05260 | 1.000000 | d |
| 8 | 1355.17400 | 15.58710 | 1.504150 | L4 |
| 9 | −73.55600 | 10.28750 | 1.000000 | e |
| 10 | 135.96800 | 10.59920 | 1.536390 | L5 |
| 11 | −200.04700 | 13.09320 | 1.000000 | f |
| 12 | 81.78000 | 9.35230 | 1.562260 | L6 |
| 13 | 160.24400 | 24.00410 | 1.000000 | g |
| 14 | −463.01200 | 9.66400 | 1.536390 | L7 |
| 15 | −146.45400 | 2.80570 | 1.602500 | |
| 16 | 64.24100 | 34.91510 | 1.000000 | h |
| 17 | 49.49500 | 8.41700 | 1.627530 | L8 |
| 18 | 30.04000 | 11.22270 | 1.000000 | i |
| 19 | −16.99700 | 2.49390 | 1.602500 | L9 |
| 20 | 351.55900 | 11.53450 | 1.504150 | |
| 21 | −22.57200 | 1.24700 | 1.000000 | j |
| 22 | −654.15900 | 9.97570 | 1.504150 | L10 |
| 23 | −74.32800 | 4.75150 | 1.000000 | k |
| 24 | 153.24500 | 11.53450 | 1.536390 | L11 |
| 25 | −275.84600 | 8.72880 | 1.000000 | l |
| 26 | 50.46800 | 7.17010 | 1.562260 | L12 |
| 27 | 144.70600 | 10.91100 | 1.000000 | m |
| 28 | 41.10500 | 7.27400 | 1.562260 | L13 |
| 29 | −387.53000 | 11.22270 | 1.000000 | n |
| 30 | −95.33700 | 3.11740 | 1.627530 | L14 |
| 31 | −291.36200 | | 1.000000 | o |
| | | $D_{31} = 12.46970$ | | |

TABLE 2

| Space No. | | $\Delta X$ ($\mu$m) | $\Delta Z$ ($\mu$m) |
|---|---|---|---|
| 1 | a | +0.031 | 0.37 |
| 2 | b | +0.038 | −0.49 |
| 3 | c | +1.164 | −2.47 |
| 4 | d | −1.173 | 3.05 |
| 5 | e | −2.086 | 5.65 |
| 6 | f | −1.388 | 4.19 |
| 7 | g | +0.194 | −0.93 |
| 8 | h | +0.131 | −0.03 |
| 9 | i | +0.116 | −4.80 |
| 10 | j | +0.143 | 4.04 |
| 11 | k | +0.127 | 2.06 |
| 12 | l | +0.224 | 2.06 |
| 13 | m | +0.136 | 0.89 |
| 14 | n | −0.008 | 0.62 |
| 15 | o | +0.012 | 0.65 |
| Entire System | | +1.004 | 14.83 |

FIRST EMBODIMENT:

From Table 2 above, the amounts of variation in magnification in the first space a, i.e., the space between the reticle and the projection lens, and the fifteenth space O, i.e., the space between the wafer and the projection lens, are both positive, and the total thereof is 0.043. Accordingly, by shielding all of the spaces formed in the projection lens, i.e., the second space b to the fourteenth space n, from the atmospheric pressure and hermetically sealing them, the variation in magnification attributable to these spaces in the projection lens does not occur, but only the variation in magnification by the first space a and the fifteenth space o occurs and it becomes possible to reduce the variation in magnification which may be caused by the entire system to about 4%.

Also, by shielding all of the spaces formed in the projection lens from the atmospheric pressure, the variation in the imaging plane becomes 1.02 $\mu$m and can be reduced to about 7% of the variation which may be caused by the entire system.

Figure 2:
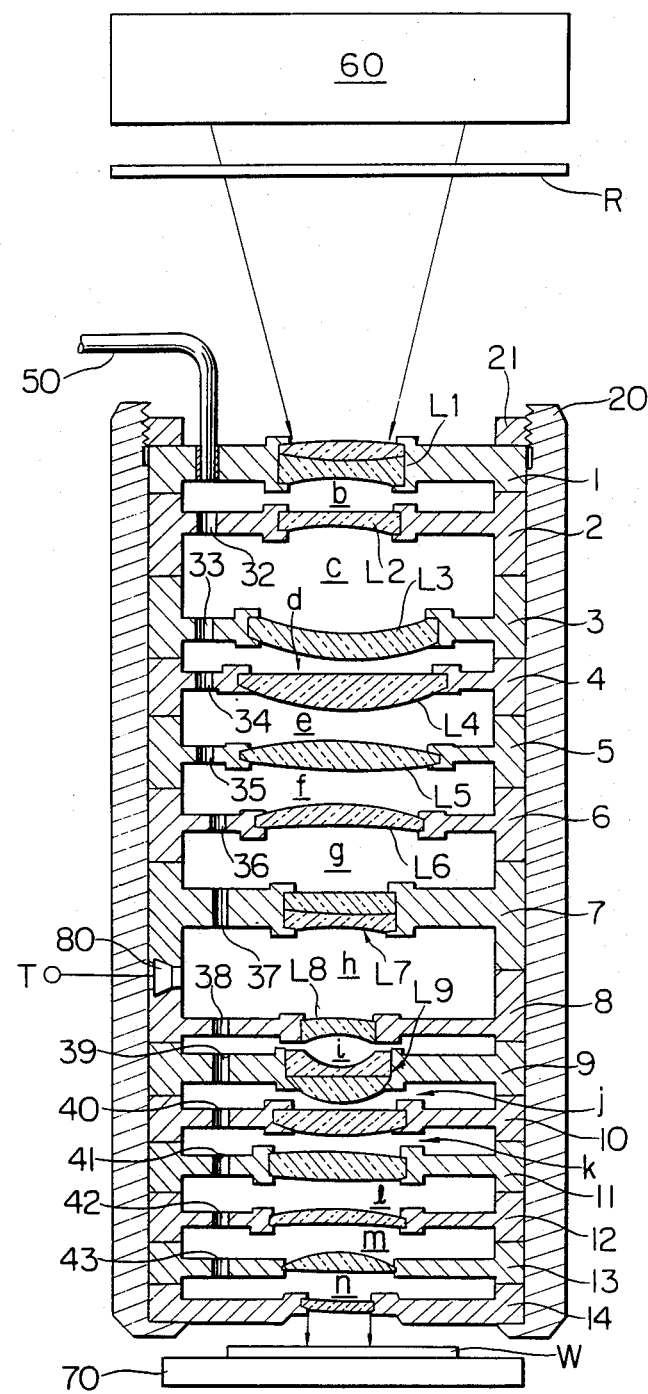
FIG. 2 is a cross-sectional view showing particularly the projection lens of a projection exposure apparatus according to a first embodiment of the present invention.

FIG. 2 shows the barrel structure and pressure control means of the projection lens shown in Table 1. The fourteen lenses L1, L2, ..., L14 forming the projection lens are supported by a first support cylinder 1, a second support cylinder 2, ..., a fourteenth support cylinder 14, respectively. By these fourteen support cylinders being stacked one upon another, inner barrels are substantially formed and these are integrally supported by an outer barrel 20 and fixed by a keeper ring 21. Air chambers corresponding to the air spaces b-n shown in FIG. 1 are formed between the support cylinders. Throughholes 32-43 for communicating the adjacent ones of the air chambers with each other are formed in the support cylinders 2 to 13. The support cylinder 14 positioned at the fore end of the projection lens hermetically supports the lens L14 so as to isolate the air chamber n from the atmosphere and is hermetically supported by the outer barrel 20. The support cylinder 1 hermetically supports the lens L1. A packing such as an O-ring is used for this hermetic support. A tube 50 is inserted in the throughhole formed in the support cylinder 1. A packing is also disposed between the support cylinder 1 and the tube 50 for the purpose of hermetic sealing.

The projection lens reduction-projects the pattern on the reticle R uniformly illuminated by an illuminating device 60 onto the wafer W placed on a stage 70.

Figure 3:
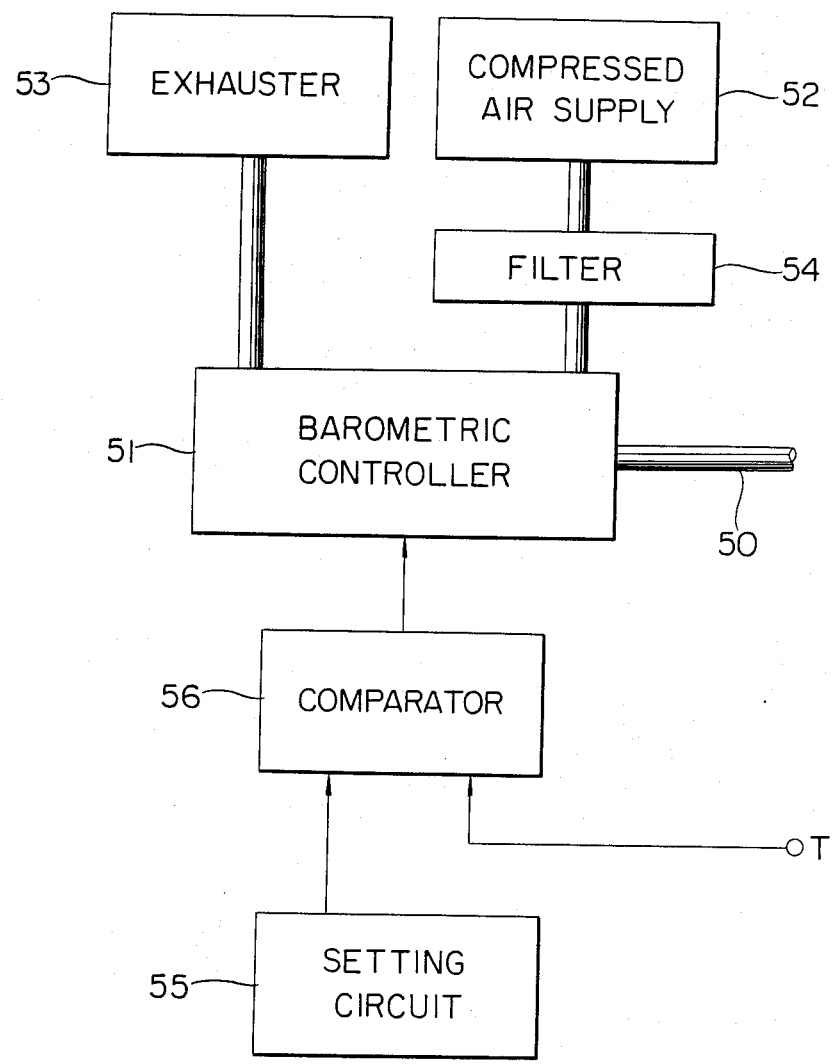
FIG. 3 is a block diagram showing the construction of a pressure control device.

A barometric controller 51 shown in FIG. 3 integrally controls the pressures in the air chambers b-n through the tube 50. When the pressures in the air chambers are to be increased, the barometric controller feeds the compressed air from a compressed air supply device 52 into the air chambers b-n, and when the pressures in the air chambers are to be decreased, the barometric controller discharges the air in the air chambers b-n through an exhauster 53. A filter 54 for cleaning the air is disposed between the barometric controller and the compressed air supply device. The projection lens is provided with a pressure sensor 80 for detecting the pressure in the air chamber h. A setting circuit 55 sets the atmospheric pressure in accordance with the height above sea-level of the place in which the projection exposure apparatus is used. A comparator circuit 56 compares the output signal of the pressure sensor 80 produced from a terminal T with the output signal of the setting circuit 55 and produces a signal indicative of the difference between these two output signals. The barometric controller 51 controls the pressures in the air chambers b-n with the output signal of the comparator circuit as the input so that the outputs of the pressure sensor 80 and the setting circuit 55 assume a predetermined relation, for example, become coincident with each other.

Figure 4:
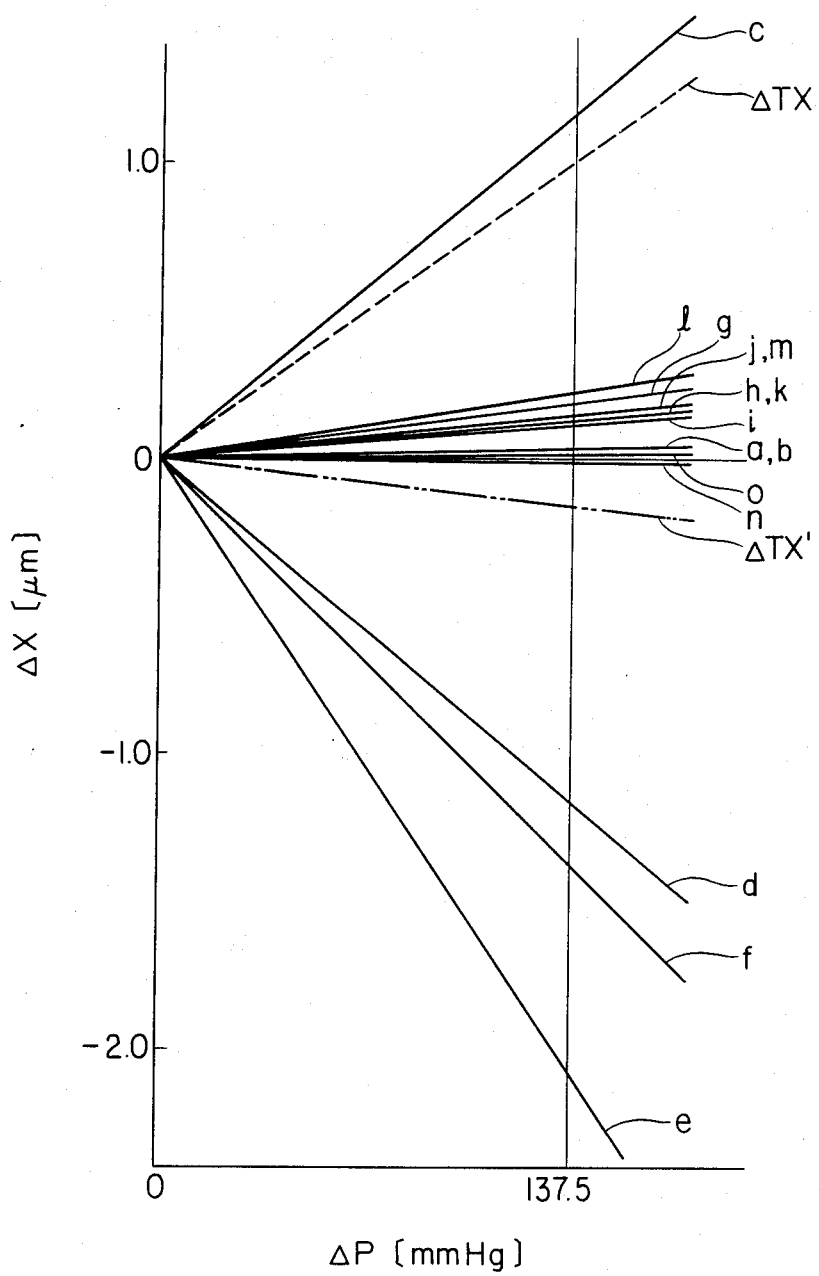
FIG. 4 is a graph showing the variation in magnification in each space in the projection lens of FIG. 1.

SECOND EMBODIMENT:

The values of the spaces with regard to the variation $\Delta X$ in magnification shown in Table 2 above may be graphically depicted as shown in FIG. 4. The ordinate of the graph represents the variation $\Delta X$ in magnification, the abscissa of the graph represents the variation $\Delta P$ in pressure, and symbols shown for the respective straight lines in the graph correspond to the respective spaces. The variation $\Delta TX$ in magnification in the entire system is indicated by a broken line.

From the graph, it can be seen that the variation in magnification caused singly by the third air space c has an inclination most approximate to the variation $\Delta TX$ in magnification by the entire system. Accordingly, by isolating only the third air space c from the atmosphere, the variation in magnification of the entire system for the variation in atmospheric pressure can be corrected to a degree that it becomes substantially negligible. That is, only the difference between the value 1.164 of $\Delta X$ by the third air space shown in Table 2 and the value 1.004 of $\Delta X$ by the entire system is the substantial variation in magnification. Accordingly, in this case, it is apparent that the amount of such variation is $-0.16$ which is a decrease to 16%. The state of the variation $\Delta TX'$ in magnification of the entire system after this correction is indicated by a phantom line in the graph.

It is possible to correct the variation in magnification caused by the fluctuation of the atmospheric pressure also by hermetically sealing not only one air space but a combination of plural air spaces so as to shield it from the atmosphere. If, for example, in the above-described projection lens, the six lens spacings from the seventh air space g to the twelfth air space l are shielded from the atmosphere and hermetically sealed integrally, the sum 0.935 of the fluctuations of magnification caused by these six air spaces can be reduced to zero and therefore, the variation in magnification caused by the entire system is only 0.069. That is, the fluctuation of magnification in the entire system is corrected to 6.9%. Also, if the thirteenth air space m is shielded from the atmosphere and hermetically sealed in addition to these six air spaces, the variation in magnification in the entire system will be $-0.067$ and better correction will become possible. Further, if the fourteenth air space n is also shielded from the atmosphere and hermetically sealed to thereby form a total of eight hermetically sealed spaces, the amount of correction of the variation in magnification by these eight spaces will be 1.063 and it will be possible to correct the variation in magnification of the entire system to $-0.059$.

In this embodiment, the construction in which only the third air space c is shielded from the atmosphere and hermetically sealed is simplest, but by hermetically sealing the third air space c, the variation $\Delta Z$ in the imaging plane for the variation in atmospheric pressure becomes greater. In contrast, where the eight air spaces from the seventh air space g to the fourteenth air space n are hermetically sealed, the variation in the imaging plane by these eight air spaces is corrected by a total amount of 3.91 at one time and this is somewhat more advantageous.

Figure 5:
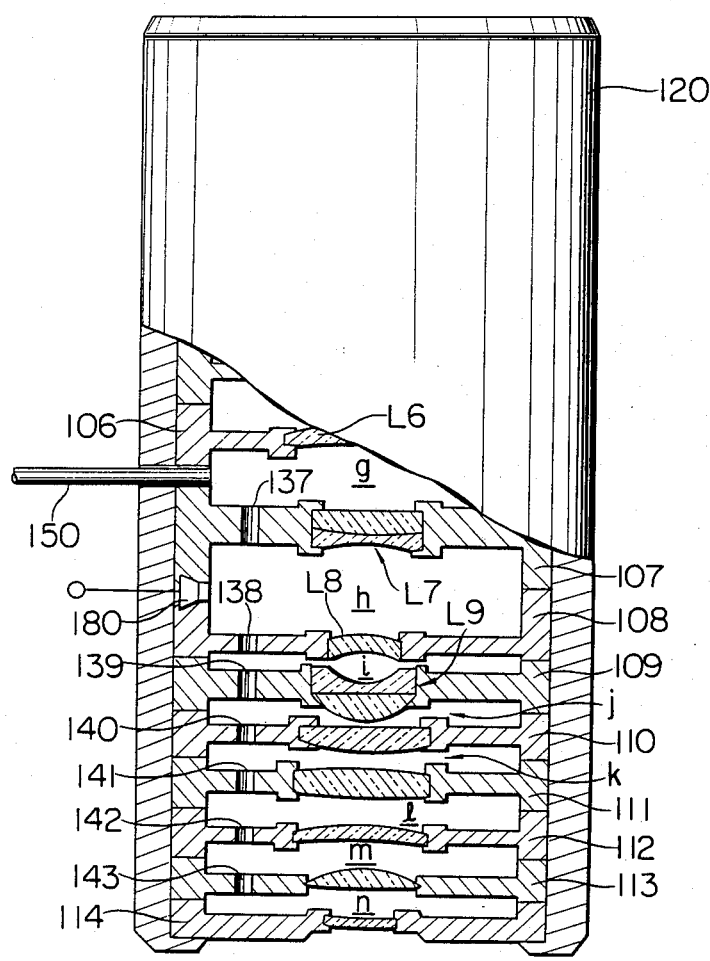
FIG. 5 is a partial cross-sectional view of a projection lens according to a second embodiment of the present invention.

In FIG. 5, there is shown the structure of a projection lens for realizing this last-described specific example. The air chambers g-n are hermetically sealed by support cylinders 106 and 114 on the opposite sides thereof, and 0-rings or the like are held between the two support cylinders and an outer barrel 120. Support cylinders 108-113 disposed between the air chambers g-n are formed with throughholes 137-143, and the air chamber g is connected to the barometric controller 51 of FIG. 3 by a pipe 150. A pressure sensor 180 is connected to the comparator 56 of FIG. 3. Further, the remaining air chambers b-f communicate with the atmosphere and the pressures therein vary with the atmosphere.

What is claimed is:

1. An apparatus for projecting a pattern on a first plane onto a second plane, comprising:
a projection lens system disposed between and spaced from said first plane and said second plane, said projection lens system including a plurality of lens element disposed at intervals and defining a plurality of spaces;
means for isolating at least one of said plurality of spaces from the atmosphere, said at least one space being selected such that, in the absence of the isolating of said at least one space from the atmosphere, variation in magnification of said projection lens system caused by variation of the pressure in said at least one space with atmospheric pressure is substantially equal to variation in magnification of said projection lens system caused by variation of the pressure in all of said plurality of spaces and in the spaces between said projection lens system and said first and second planes with atmospheric pressure; and
means for maintaining the refractive index in said at least one space of said projection lens system at a fixed value in spite of the variation of atmospheric pressure.

2. An apparatus according to claim 1, wherein the pressures in the spaces of said projection lens system other than said at least one space vary with atmospheric pressure.

3. An apparatus according to claim 1, wherein said maintaining means maintains the pressure in said at least one space of said projection lens system at a predetermined constant level.

4. An apparatus for projecting a pattern on a first plane onto a second plane, comprising:
a projection lens system disposed between and spaced from said first plane and said second plane, said projection lens system including a plurality of lens elements disposed at intervals and defining a plurality of spaces;

means for isolating one of said plurality of spaces from the atmosphere, said one space being selected such that, in the absence of the isolating of said one spaced from the atmosphere, variation in magnification of said projection lens system caused by variation of the pressure in said one space with atmospheric pressure is substantially equal to variation in magnification of said projection lens system caused by variation of the pressure in all of said plurality of spaces and in the spaces between said projection lens system and said first and second planes with atmospheric pressure; and means for maintaining the refractive index in said one space of said projection lens system at a fixed value in spite of the variation of atmospheric pressure.

5. An apparatus according to claim 4, wherein the pressures in the spaces of said projection lens system other than said one space vary with atmospheric pressure.

6. An apparatus according to claim 4, wherein said maintaining means maintains the pressure in said one space of said projection lens system at a predetermined constant level.

7. In a projection lens system disposed between and spaced from a first plane and a second plane, and including a plurality of lens elements disposed at intervals and defining a plurality of spaces, a method for maintaining magnification of said projection lens system independent from fluctuation of atmospheric pressure, comprising the steps of:

(a) determining the variation $\Delta TX$ in magnification of said projection lens system when the pressures in all of said plurality of spaces and the spaces between said projection lens system and said first and second planes fluctuate with atmospheric pressure, determining the variation $\Delta X$ in magnification of said projection lens system when the pressure in each of the spaces of said plurality of spaces fluctuates individually with atmospheric pressure;

(b) selecting at least one of said plurality of spaces such that the total variation $\Delta X$ corresponding to said at least one space is substantially equal to the variation $\Delta TX$;

(c) isolating said at least one space from the atmosphere; and (d) maintaining the refractive index in said at least one space at a fixed value in spite of the variation of atmospheric pressure.

8. A method according to claim 7, wherein said refractive index is maintained by fixing the pressure in said at least one space at a predetermined level.

9. In a projection lens system disposed between and spaced from a first plane and a second plane, and including a plurality of lens elements disposed at intervals and defining a plurality of spaces, a method for maintaining magnification of said projection lens system independent from fluctuation of atmospheric pressure, comprising the steps of:

(a) determining the variation $\Delta TX$ in magnification of said projection lens system when the pressures in all of said plurality of spaces and the spaces between said projection lens system and said first and second planes fluctuate with atmospheric pressure, determining the variation $\Delta X$ in magnification of said projection lens system when the pressure in each of the spaces of said plurality of spaces fluctuates individually with atmospheric pressure;

(b) selecting one of said plurality of spaces such that the variation $\Delta X$ corresponding to said one space is substantially equal to the variation $\Delta TX$;

(c) isolating said one space from the atmosphere; and (d) maintaining the refractive index in said one space at a fixed value in spite of the variation of atmospheric pressure.

10. A method according to claim 9, wherein said refractive index is maintained by fixing the pressure in said selected one space at a predetermined level.

* * * * *